(12) United States Patent
Dong et al.

(10) Patent No.: US 11,480,830 B2
(45) Date of Patent: Oct. 25, 2022

(54) DISPLAY PANEL AND DISPLAY DEVICE

(71) Applicant: Beijing BOE Technology Development Co., Ltd., Beijing (CN)

(72) Inventors: Xue Dong, Beijing (CN); Liwei Liu, Beijing (CN); Xinxing Wang, Beijing (CN); Yun Sik Im, Beijing (CN); Hyun Sic Choi, Beijing (CN); Jaegeon You, Beijing (CN); Yinglong Huang, Beijing (CN); Heecheol Kim, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 680 days.

(21) Appl. No.: 16/335,862

(22) PCT Filed: Sep. 6, 2018

(86) PCT No.: PCT/CN2018/104398
§ 371 (c)(1),
(2) Date: Mar. 22, 2019

(87) PCT Pub. No.: WO2019/114336
PCT Pub. Date: Jun. 20, 2019

(65) Prior Publication Data
US 2021/0341780 A1 Nov. 4, 2021

(30) Foreign Application Priority Data
Dec. 15, 2017 (CN) .......................... 201711353502.2

(51) Int. Cl.
*G02F 1/133* (2006.01)
*G02F 1/1339* (2006.01)
(Continued)

(52) U.S. Cl.
CPC ........ *G02F 1/13394* (2013.01); *G02F 1/1368* (2013.01); *G02F 1/13396* (2021.01);
(Continued)

(58) Field of Classification Search
CPC ..................................................... H01L 51/525
See application file for complete search history.

(56) References Cited

U.S. PATENT DOCUMENTS 9,933,665 B2 4/2018 Jeon et al.
2007/0216347 A1 9/2007 Kaneko et al.
(Continued)

FOREIGN PATENT DOCUMENTS

CN 105446021 A 3/2016
CN 106597759 A 4/2017

OTHER PUBLICATIONS

Dec. 5, 2018—(WO) International Search Report and the Written Opinion Appn PCT/CN2018/104398 with English Translation.
(Continued)

*Primary Examiner* — Benjamin P Sandvik
(74) *Attorney, Agent, or Firm* — Banner & Witcoff, Ltd.

(57) ABSTRACT

A display panel and a display device are provided. In the display panel, a plurality of main spacers and a plurality of auxiliary spacers are disposed on a side of a first substrate close to a second substrate, the second substrate further includes a plurality of first lug bosses and a plurality of second lug bosses; an orthographic projection of the main spacers on the second substrate is at least partially overlapped with an orthographic projection of a corresponding first lug boss on the second substrate; an orthographic projection of the auxiliary spacers on the second substrate is away from an orthographic projection of a corresponding second lug boss on the second substrate by a preset distance; and the distance between each of the auxiliary spacers and the corresponding second lug boss is less than a height of the first lug bosses.

19 Claims, 4 Drawing Sheets

(51) Int. Cl.
    *G02F 1/1335*    (2006.01)
    *G02F 1/1362*    (2006.01)
    *G02F 1/1368*    (2006.01)
    *H01L 27/12*     (2006.01)

(52) U.S. Cl.
    CPC .. *G02F 1/133512* (2013.01); *G02F 1/136286* (2013.01); *H01L 27/124* (2013.01)

(56) References Cited

U.S. PATENT DOCUMENTS

| | | |
|---|---|---|
| 2007/0216847 A1 | 9/2007 | Chang et al. |
| 2012/0314178 A1* | 12/2012 | Doi .................... G02F 1/13394 349/155 |
| 2015/0253607 A1 | 9/2015 | Cho |
| 2015/0253608 A1 | 9/2015 | Cho |
| 2015/0277201 A1 | 10/2015 | Kong |
| 2019/0067391 A1* | 2/2019 | Li ..................... H01L 51/5044 |
| 2020/0192137 A1* | 6/2020 | Dong .................. G02F 1/1339 |

OTHER PUBLICATIONS

Aug. 13, 2021—(EP) Extended European Search Report Appn No. 18857406.5.

* cited by examiner

DISPLAY PANEL AND DISPLAY DEVICE

The application is a U.S. National Phase Entry of International Application No. PCT/CN20187104398 filed on Sep. 6, 2018, designating the United States of America and claiming priority to Chinese Patent Application No. 201711353502.2, filed Dec. 15, 2017, The present application claims priority to and the benefit of the above-identified applications and the above-identified applications are incorporated by reference herein in their entirety.

TECHNICAL FIELD

Embodiments of the present invention relate to a display panel and a display device.

BACKGROUND

With the continuous development of display technology, liquid crystal display (LCD) has become a mainstream display device due to the advantages such as fast response speed, high integration and low power consumption. Generally, an LCD panel comprises a liquid crystal cell formed by an array substrate and an opposed substrate cell-assembled with the array substrate, and a liquid crystal molecular layer filled in the liquid crystal cell. The LCD panel changes the molecular arrangement of the liquid crystal molecules in the liquid crystal molecular layer by electric fields, and a liquid crystal light valve can be formed by cooperation with polarizers disposed on both sides of the LCD panel, thereby realizing the display function. In addition, the LCD can further realize color display in cooperation with color filter (CF) patterns formed on the array substrate or the opposed substrate.

In the liquid crystal cell of the LCD panel, in order to maintain the uniformity of the cell gap of the liquid crystal cell at various positions, post spacers (PS) having an elastic restoring force are usually disposed between the array substrate and the opposed substrate. The PS is in a compressed state and has the function of supporting the liquid crystal cell, thereby maintaining the stability and uniformity of the cell gap of the LCD panel.

SUMMARY

At least one embodiment of the disclosure provides a display panel, comprising: a first substrate; and a second substrate provided oppositely to the first substrate, wherein a plurality of main spacers and a plurality of auxiliary spacers are provided on a side of the first substrate close to the second substrate; the second substrate further includes a plurality of first lug bosses and a plurality of second lug bosses; an orthographic projection of each of the main spacers on the second substrate is at least partially overlapped with an orthographic projection of a corresponding first lug boss on the second substrate; an orthographic projection of each of the auxiliary spacers on the second substrate is away from an orthographic projection of a corresponding second lug boss on the second substrate by a preset distance along an offset direction; and a distance between each of the auxiliary spacers and the corresponding second lug boss in a direction perpendicular to the second substrate is less than a height of each of the first lug bosses in the direction perpendicular to the second substrate.

For example, in the display panel provided in an embodiment of the disclosure, the preset distance is greater than 0 and less than a distance between two adjacent second lug bosses.

For example, in the display panel provided in an embodiment of the disclosure, the auxiliary spacers include first auxiliary spacers and second auxiliary spacers; an orthographic projection of each of the first auxiliary spacers on the second substrate is away from the orthographic projection of the corresponding second lug boss on the second substrate by a first distance along the offset direction; an orthographic projection of each of the second auxiliary spacers on the second substrate is away from the orthographic projection of the corresponding second lug boss on the second substrate by a second distance along the offset direction; and the second distance is less than the first distance.

For example, in the display panel provided in an embodiment of the disclosure, the second distance is one quarter to three quarters of the first distance.

For example, in the display panel provided in an embodiment of the disclosure, the orthographic projections of the plurality of auxiliary spacers on the second substrate are away from the orthographic projections of the corresponding second lug bosses on the second substrate by the preset distance along different offset directions.

For example, in the display panel provided in an embodiment of the disclosure, the different offset directions include a first direction, a second direction, a third direction and a fourth direction; the first direction is opposite to the fourth direction; the second direction is opposite to the third direction; and the first direction is perpendicular to the second direction.

For example, in the display panel provided in an embodiment of the disclosure, the different offset directions further include a fifth direction, a sixth direction, a seventh direction and an eighth direction; the fifth direction is opposite to the eighth direction; the sixth direction is opposite to the seventh direction; an angle between the fifth direction and the first direction is in a range of 30-60°; and an angle between the sixth direction and the second direction is in a range of 30-60°.

For example, in the display panel provided in an embodiment of the disclosure, the angle between the fifth direction and the first direction is 45°; and the angle between the sixth direction and the second direction is 45°.

For example, in the display panel provided in an embodiment of the disclosure, the second substrate further includes: gate lines, wherein the main spacers are arranged in an array; and the main spacers in a same row are linearly arranged along an extension direction of the gate lines.

For example, in the display panel provided in an embodiment of the disclosure, the first direction is perpendicular to the extension direction of the gate lines.

For example, in the display panel provided in an embodiment of the disclosure, the second lug bosses are arranged in an array on the second substrate; and the second lug bosses in a same row are linearly arranged along the extension direction of the gate lines.

For example, in the display panel provided in an embodiment of the disclosure, the auxiliary spacers and the main spacers are arranged in an array; and the auxiliary spacers and the main spacers in a same row are linearly arranged along the extension direction of the gate lines.

For example, in the display panel provided in an embodiment of the disclosure, the display panel further comprises: a black matrix on the first substrate or the second substrate, wherein the orthographic projections of the main spacers on the second substrate fall into an orthographic projection of the black matrix on the second substrate.

For example, in the display panel provided in an embodiment of the disclosure, a shortest distance between an edge of the black matrix and an edge of each of the main spacers is less than 15 μm.

For example, in the display panel provided in an embodiment of the disclosure, in areas provided with the first lug bosses or the second lug bosses, the second substrate includes thin-film transistors.

For example, in the display panel provided in an embodiment of the disclosure, the preset distance is an offset distance between the first substrate and the second substrate under an external force.

For example, in the display panel provided in an embodiment of the disclosure, the auxiliary spacers and the second lug bosses are arranged on an edge part of the black matrix.

An embodiment of the disclosure further provided a display device, comprising the display panel according to any items as mentioned above.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

The spacers have the function of maintaining the uniformity of the cell gap of the liquid crystal cell at various positions in the LCD panel, so as to maintain the stability and the uniformity of the cell gap of the LCD panel. However, the spacers also restrict the aperture ratio of the LCD panel to a certain degree. In the case of displacement of the LCD panel due to external force, the spacers will scratch an alignment film disposed on the array substrate or the opposed substrate, so the liquid crystal molecules at this position cannot be correctly aligned, resulting in a defect such as bright spots or dark spots on the LCD panel. In order to avoid the above phenomenon, BMs will usually be set to be wide so as to cover the spacers. However, the wide setting of the BMs can reduce the aperture ratio of the display panel.

Figure 1:
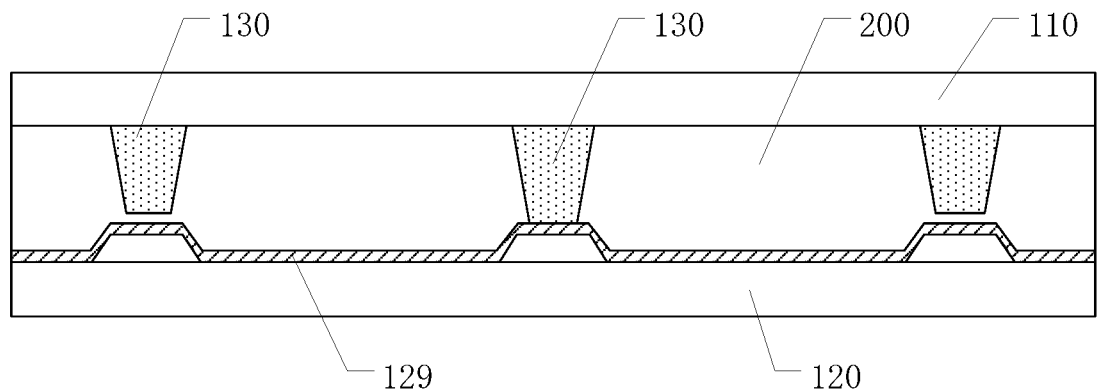
FIG. 1 is a schematic sectional view of an LCD panel.

FIG. 1 is a schematic sectional view of an LCD panel. As shown in FIG. 1, the LCD panel comprises a first substrate 110, an opposed substrate cell-assembled with the first substrate 110, and a liquid crystal molecular layer 200 disposed between the first substrate 110 and the second substrate 120. The LCD panel at least further comprises an alignment film 129 disposed on one side of the second substrate 120 facing the first substrate 110, and spacers 130 disposed on the first substrate 110 or the second substrate 120. For instance, as shown in FIG. 1, the spacers 130 may be disposed on the first substrate 110, and may be arranged on one side of the first substrate 110 close to the second substrate 120. The alignment film 129 can induce liquid crystal molecules in the liquid crystal molecular layer 200 for orientation arrangement. For instance, an oriented channel is formed on a surface of the alignment film 129 by friction process, so as to induce the liquid crystal molecules in the liquid crystal molecular layer 200 for orientation arrangement. When the LCD panel displays dark state, the liquid crystal molecules in the liquid crystal molecular layer 200 will not deflect, and light cannot run through the LCD panel. When the LCD panel displays bright state, the liquid crystal molecules in the liquid crystal molecular layer 200 will deflect under the action of electric fields, and light can run through the LCD panel. Moreover, the LCD panel can also display light with color corresponding to CF patterns through the function of the CF patterns disposed on the first substrate and the second substrate.

Figure 2:
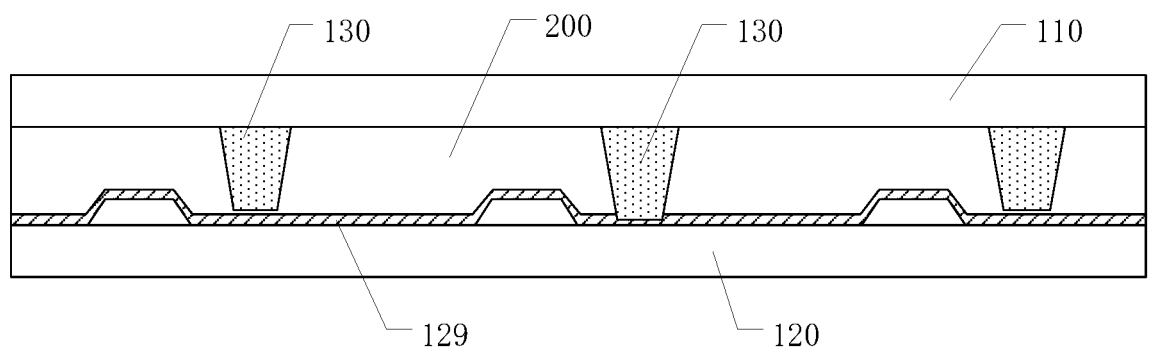
FIG. 2 is a schematic diagram illustrating the relative displacement between a first substrate and a second substrate of the LCD panel as shown in FIG. 1 due to external force.

FIG. 2 is a schematic diagram illustrating the relative replacement between the first substrate and the second substrate of the LCD panel as shown in FIG. 1 due to external force. As shown in FIG. 2, in the case of the phenomenon of relative displacement (offset) between the first substrate 110 and the second substrate 120 of the LCD panel due to external force, the spacer 130 will be displaced from an initial position and then scratch the alignment film 129. The scratched alignment film cannot induce the liquid crystal molecules in the liquid crystal molecular layer 200 for orientation arrangement. Thus, no matter the display panel displays bright state or dark state, light can run through the LCD panel from the scratched position of the alignment film, so poor effect such as light leakage can be caused. In order to overcome the defect, the area scratched by the spacer can be shielded by increase of the width of the BM. However, the increase of the width of the BM will result in the defects such as the reduction of the aperture ratio and the transmittance.

Embodiments of the present invention provide a display panel and a display device. The display panel comprises a first substrate and a second substrate arranged opposite to the first substrate; a plurality of main spacers and a plurality of auxiliary spacers are disposed on the first substrate; the second substrate further includes a plurality of first lug bosses and a plurality of second lug bosses; an orthographic projection of the main spacer on the second substrate is at least partially overlapped with an orthographic projection of the correspondingly arranged first lug boss on the second substrate; and an orthographic projection of the auxiliary spacer on the second substrate is away from an orthographic projection of the second lug boss on the second substrate by a preset distance along the offset direction. Thus, in the case of relative displacement between the first substrate and the second substrate of the display panel, the auxiliary spacer can be moved to the second lug boss and has the function of supporting the first substrate and the second substrate, so as to prevent the main spacer from scratching the alignment film, thereby avoiding the defects such as light leakage caused by the fact that the alignment film is scratched by the spacer. In addition, as the display panel can avoid the defects such as light leakage caused by the fact that the alignment film is scratched by the spacer, the display panel does not need to additionally increase the width of the BMs, so the aperture ratio of the display panel can be improved.

Detailed description will be given below to the display panel and the display device, provided by the embodiment of the present invention, with reference to the accompanying drawings.

Figure 3:
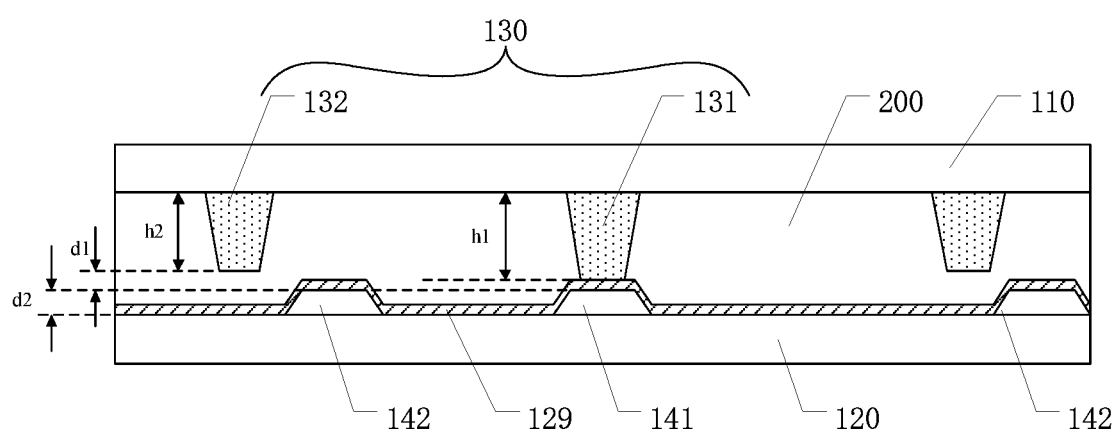
FIG. 3 is a schematic sectional view of a display panel provided by one embodiment of the present invention.

FIG. 3 is a schematic sectional view of a display panel provided by one embodiment of the present invention. As shown in FIG. 3, the display panel comprises a first substrate 110 and a second substrate 120 arranged opposite to the first substrate 110; spacers 130 are disposed on the first substrate 110, namely the spacers 130 are arranged on one side of the first substrate 110 close to the second substrate 120; and the spacers 130 are disposed between the first substrate 110 and the second substrate 120 to maintain the distance between the first substrate 110 and the second substrate 120, namely the cell gap of a liquid crystal cell formed by the first substrate 110 and the second substrate 120. The spacers 130 include a plurality of main spacers 131 and a plurality of auxiliary spacers 132. The second substrate 120 further includes a plurality of first lug bosses 141 and a plurality of second lug bosses 142. The plurality of main spacers 131 are arranged corresponding to the plurality of first lug bosses 141, and an orthographic projection of the main spacer 131 on the second substrate 120 is at least partially overlapped with an orthographic projection of the correspondingly arranged first lug boss 141 on the second substrate 120, that is, the main spacer 131 is disposed on the correspondingly arranged first lug boss 141. The plurality of auxiliary spacers 132 are arranged corresponding to the plurality of second lug bosses 142, and an orthographic projection of the auxiliary spacer 132 on the second substrate 120 is preset distance away from an orthographic projection of the correspondingly arranged second lug boss 142 on the second substrate 120 along the offset direction. It should be noted that the above correspondingly arranged second lug boss may be the second lug boss closest to the auxiliary spacer, and the above offset direction refers to the direction from a position provided with the orthographic projection of the second lug boss on the second substrate to a position provided with the orthographic projection of the auxiliary spacer on the second substrate. The above offset direction may be determined according to the direction of relative displacement between the first substrate and the second substrate. The above preset distance may be determined according to the distance of relative displacement between the first substrate and the second substrate. In addition, the above preset distance is not zero.

Figure 4:
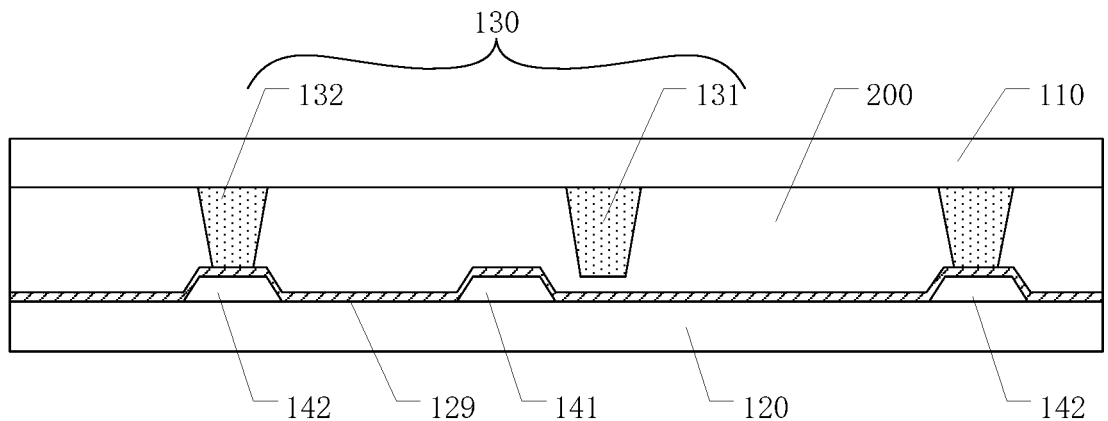
FIG. 4 is a schematic diagram illustrating the relative displacement between a first substrate and a second substrate of the LCD panel as shown in FIG. 3.

In the display panel provided by the embodiment, the plurality of main spacers 131 may be arranged corresponding to the plurality of first lug bosses 141, and the orthographic projection of the main spacer 131 on the second substrate 120 is at least partially overlapped with the orthographic projection of the correspondingly arranged first lug boss 141 on the second substrate 120; and at this point, the main spacer 131 may have the function of maintaining the distance between the first substrate 110 and the second substrate 120. FIG. 4 is a schematic sectional view illustrating the relative displacement between the first substrate and the second substrate in the display panel as shown in FIG. 3. As shown in FIG. 4, as the orthographic projection of the auxiliary spacer 132 on the second substrate 120 is preset distance away from the orthographic projection of the correspondingly arranged second lug boss 142 on the second substrate 120 along the offset direction, in the case of relative displacement between the first substrate 110 and the second substrate 120 of the display panel along an opposite direction opposite to the above offset direction, for instance, relative displacement between the first substrate 110 and the second substrate 120 along the direction opposite to the above offset direction, caused by external force, the orthographic projection of the auxiliary spacer 132 on the second substrate 120 is overlapped with the orthographic projection of the correspondingly arranged second lug boss 142 on the second substrate 120, namely the auxiliary spacer 132 is moved to the correspondingly arranged second lug boss 142; and at this point, even the main spacer 131 slips from the first lug boss 141 due to the relative displacement between the first substrate 110 and the second substrate 120, the auxiliary spacer 132 can move the second lug boss 142 and have the function of supporting the first substrate 110 and the second substrate 120, so as to prevent main spacer from scratching the alignment film.

For instance, in some examples, as shown in FIGS. 3 and 4, the preset distance is greater than 0 and less than the distance between two adjacent second lug bosses 142.

For instance, in some examples, as shown in FIGS. 3 and 4, the display panel further comprises a liquid crystal molecular layer 200 disposed between the first substrate 110 and the second substrate 120; and an alignment film 129 disposed on one side of the second substrate 120 close to the first substrate 110. The alignment film 129 can induce liquid crystal molecules in the liquid crystal molecular layer 200 for orientation arrangement.

For instance, in some examples, as shown in FIG. 3, the height h1 of the main spacer 131 in the direction perpendicular to the second substrate 120 is greater than the height h2 of the auxiliary spacer 132 in the direction perpendicular to the second substrate 120, and the distance d1 between the auxiliary spacer 132 and the second lug boss 142 in the direction perpendicular to the second substrate 120 is less than the height d2 of the first lug boss 141 in the direction perpendicular to the first substrate 120. In the case of relative displacement, when at least one part of auxiliary spacers 132 fall on the second lug bosses 142, as d1 is less than d2, when the auxiliary spacer 132 falls on the second lug boss 142, the distance between the main spacer 131 and the first substrate 110 is greater than zero. Thus, the display panel can ensure that the auxiliary spacer 132 can move the second lug boss 142 so as to prevent the main spacer 131 from scratching the alignment film 129 when the main spacer 131 slips from the first lug boss 141 due to the relative displacement between the first substrate 110 and the second substrate 120. For instance, in some examples, in the display panel, apart from the above auxiliary spacers, conventional auxiliary spacers and correspondingly arranged second lug bosses can be also arranged. Orthographic projections of the above conventional auxiliary spacer and the correspondingly arranged second lug boss on the second substrate are at least partially overlapped, so as to help maintaining the distance between the first substrate and the second substrate when the first substrate and the second substrate of the display panel are not displaced.

For instance, in some examples, in areas provided with the first lug bosses or the second lug bosses, the second substrate includes thin film transistors (TFTs). That is to say, when the second substrate is an array substrate, the first lug bosses or the second lug bosses can be formed by utilization of the step difference naturally formed by the TFTs on the second substrate. Of course, the embodiment of the present invention includes but not limited thereto, and the first lug bosses or the second lug bosses can also be formed by patterning other layer structures.

For instance, in some examples, the height of the first lug bosses and the second lug bosses in the direction perpendicular to the second substrate is equal.

For instance, in some examples, the preset distance is the offset distance between the first substrate and the second substrate under external force.

Figure 5:
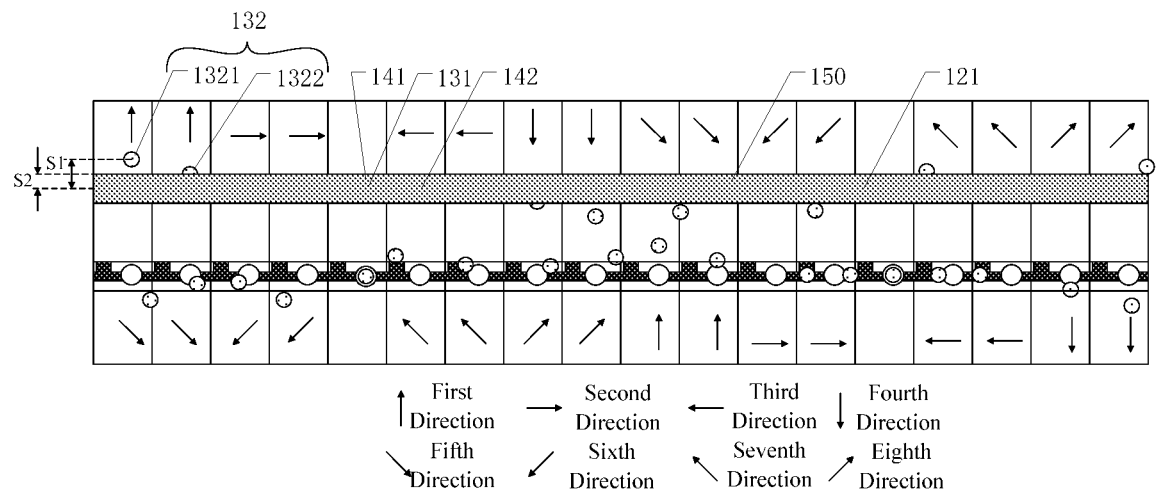
FIG. 5 is a schematic plan view of another display panel provided by one embodiment of the present invention.

FIG. 5 is a schematic plan view of another display panel provided by one embodiment of the present invention. As shown in FIG. 5, the auxiliary spacers 132 include first auxiliary spacers 1321 and second auxiliary spacers 1322; an orthographic projection of the first auxiliary spacer 1321 on the second substrate 120 is first distance S1 away from an orthographic projection of a correspondingly arranged second lug boss 142 on the second substrate 120 along the offset direction; an orthographic projection of the second auxiliary spacer 1322 on the second substrate 120 is second distance S2 away from an orthographic projection of a correspondingly arranged second lug boss 142 on the second substrate 120 along the offset direction; and the second distance S2 is less than the first distance S1. Thus, in the case of relative displacement between the first substrate 110 and the second substrate 120 of the display panel along an opposite direction opposite to the above offset direction, for instance, when the relative displacement is the first distance S1, an orthographic projection of the first auxiliary spacer 1321 on the second substrate 120 is overlapped with an orthographic projection of the correspondingly arranged second lug boss 142 on the second substrate 120, namely the first auxiliary spacer 1321 is moved to the correspondingly arranged second lug boss 142; and at this point, even the main spacer 131 slips from the first lug boss 141 due to the relative displacement between the first substrate 110 and the second substrate 120, the first auxiliary spacer 1321 can move the second lug boss 142 and have the function of supporting the first substrate 110 and the second substrate 120, so as to prevent the main spacer 131 from scratching the alignment film 129. In the case of relative displacement between the first substrate 110 and the second substrate 120 of the display panel along the opposite direction opposite to the above offset direction, for instance, when the relative displacement is the second distance S2, an orthographic projection of the second auxiliary spacer 1322 on the second substrate 120 is overlapped with the correspondingly arranged second lug boss 142 on the second substrate 120, namely the second auxiliary spacer 1322 is moved to the correspondingly arranged second lug boss 142; and at this point, even the main spacer 131 slips from the first lug boss 141 due to the relative displacement between the first substrate 110 and the second substrate 120, the second auxiliary spacer 1322 can move the second lug boss 142 and have the function of supporting the first substrate 110 and the second substrate 120, so as to prevent the main spacer 131 from scratching the alignment film 129. It should be noted that the present invention includes but not limited thereto, and the auxiliary spacers may also include auxiliary spacers with other distance deviated along the offset direction apart from the first auxiliary spacers and the second auxiliary spacers, so as to ensure that at least one of the auxiliary spacers can be moved to the correspondingly arranged second lug boss in the case of relative displacement between the first substrate 110 and the second substrate 120 of the display panel along the opposite direction opposite to the above offset direction, thereby preventing the main spacer 131 from scratching the alignment film 129.

For instance, in some examples, the second distance S2 may be set to be one quarter to three quarters of the first distance S1, so as to reasonably arrange the first auxiliary spacers and the second auxiliary spacers and improve the utilization rate of the auxiliary spacers.

For instance, the second distance S2 may be set to be a half of the first distance S1, so as to reasonably arrange the first auxiliary spacers and the second auxiliary spacers and improve the utilization rate of the auxiliary spacers.

It should be noted that the above "first distance" may be the distance between two adjacent edges of the orthographic projection of the first auxiliary spacer on the second substrate and the orthographic projection of the correspondingly arranged second lug boss on the second substrate; and similarly, the above "second distance" may be the distance of two adjacent edges of the orthographic projection of the second auxiliary spacer on the second substrate and the orthographic projection of the correspondingly arranged second lug boss on the second substrate. For instance, in some examples, as shown in FIG. 5, the orthographic projections of the plurality of auxiliary spacers 132 on the second substrate 120 are preset distance away from the orthographic projections of the second lug bosses 142 on the second substrate 120 along different offset directions. That is to say, the plurality of auxiliary spacers 132 are deviated from the correspondingly arranged second lug bosses 142 along different directions. Thus, in the case of relative displacement between the first substrate 110 and the second substrate 120 of the display panel along different directions, the orthographic projections of some auxiliary spacers on the second substrate will be overlapped with the orthographic projections of the correspondingly arranged second lug bosses on the second substrate, namely some auxiliary spacers will be moved to the correspondingly arranged second lug bosses; and at this point, even the main spacers slip from the first lug bosses due to the relative displacement between the first substrate and the second substrate, partial auxiliary spacers can move the second lug boss and have the function of supporting the first substrate and the second substrate, so as to prevent the main spacer from scratching the alignment film.

For instance, in some examples, as shown in FIG. 5, the above different offset directions may include first direction, second direction, third direction and fourth direction; the first direction is opposite to the fourth direction; the second direction is opposite to the third direction; and the first direction is perpendicular to the second direction.

For instance, in some examples, as shown in FIG. 5, the above different offset directions may also include fifth direction, sixth direction, seventh direction and eighth direction; the fifth direction is opposite to the eighth direction; the sixth direction is opposite to the seventh direction; an angle between the fifth direction and the first direction is 30-60°; and an angle between the sixth direction and the second direction is 30-60°. Therefore, the display panel can further ensure that partial auxiliary spacers can be moved to the correspondingly arranged second lug bosses in the case of relative displacement between the first substrate and the second substrate of the display panel along different directions.

For instance, in some examples, as shown in FIG. 5, the angle between the fifth direction and the first direction is 45°, and the included angle between the sixth direction and the second direction is 45°. Thus, the first direction, the second direction, the third direction, the fourth direction, the fifth direction, the sixth direction, the seventh direction and the eighth direction are evenly distributed in the plane.

For instance, in some examples, as shown in FIG. 5, the second substrate 120 further includes gate lines 121; the main spacers 131 are arranged in an array and configured to maintain the distance between the first substrate 110 and the second substrate 120, that is, the main spacers 131 are uniformly arranged between the first substrate 110 and the second substrate 120; and the main spacers 131 in the same row are linearly arranged along the extension direction of the gate line 121.

For instance, in some examples, as shown in FIG. 5, an orthographic projection of the gate line 121 on the second substrate 120 is at least partially overlapped with an orthographic projection of the main spacer 131 on the second substrate 120.

For instance, in some examples, as shown in FIG. 5, the first direction of the above different offset directions may be the direction perpendicular to the extension direction of the gate line 121.

For instance, in some examples, as shown in FIG. 5, the second lug bosses 142 are arranged in an array on the second substrate 120; and the second lug bosses 142 in the same row are linearly arranged along the extension direction of the gate line 121.

For instance, in some examples, as shown in FIG. 5, the second lug bosses 142 and the main spacers 131 in the same row are linearly arranged along the extension direction of the gate line 121, that is, compared with the conventional design, the second lug bosses are not deviated while the auxiliary spacers 132 are deviated to realize the setting that the orthographic projection of the auxiliary spacer 132 on the second substrate 120 is preset distance away from the orthographic projection of the correspondingly arranged second lug boss 142 on the second substrate 120 along the offset direction.

For instance, in some examples, as shown in FIG. 5, the display panel further comprises: black matrixes (BMs) 150 disposed on the first substrate 110 or the second substrate 120; and the orthographic projection of the main spacer 131 on the second substrate falls into the orthographic projection of the BM 150 on the second substrate 120, that is, the main spacer 131 is disposed in a coverage range of the BM 150. Of course, the first lug boss 141 and the second lug boss 142 can also be disposed in the coverage range of the BM 150, thereby reducing the impact of the main spacers, the first lug bosses and the second lug bosses on the aperture ratio of the display panel.

For instance, in some examples, as shown in FIG. 5, the shortest distance L between the edge of the BM and the edge of the main spacer is less than 15 μm. In the display panel provided by the embodiment of the present invention, the BMs may be set to be narrow, so as to improve the aperture ratio of the display panel.

It should be noted that as the orthographic projection of the auxiliary spacer on the second substrate is preset distance away from the orthographic projection of the correspondingly arranged second lug boss on the second substrate along the offset direction, and the orthographic projection of the auxiliary spacer on the second substrate may not fall into the orthographic projection of the BM on the second substrate, the problem of reducing the aperture ratio of the display panel, caused by the increased width of the BMs, can be avoided. Of course, the embodiment of the present invention includes but not limited thereto, and the orthographic projection of the auxiliary spacer on the second substrate may also fall into the orthographic projection of the BM on the second substrate.

For instance, in some examples, as shown in FIG. 5, the auxiliary spacers 132 in the same row have all the offset directions. Of course, the present invention includes but not limited thereto, and the auxiliary spacers 132 in two lines may have all the offset directions.

Figure 6:
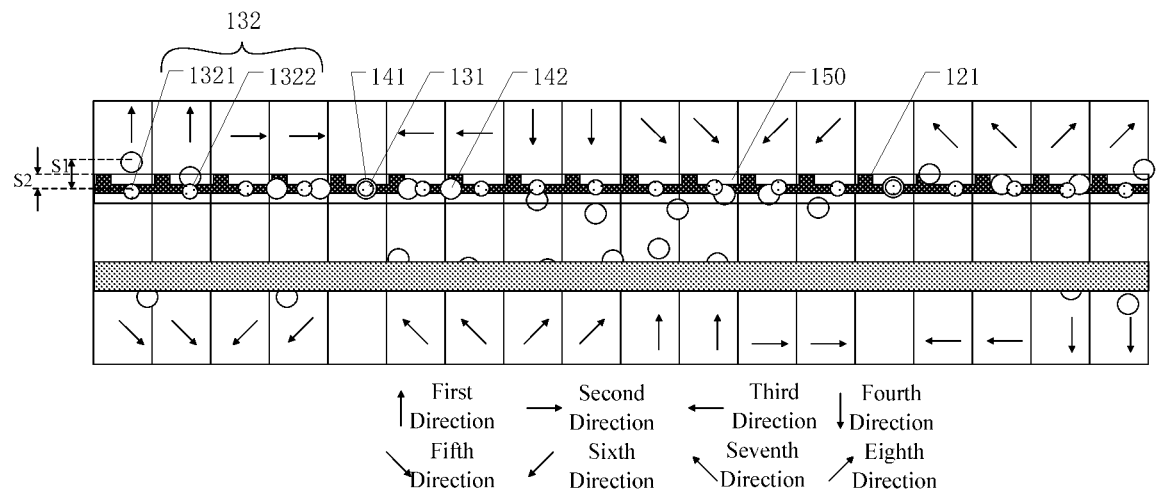
FIG. 6 is a schematic plan view of another display panel provided by one embodiment of the present invention.

FIG. 6 is a schematic plan view of another display panel provided by one embodiment of the present invention. As shown in FIG. 6, in the display panel, the auxiliary spacers 132 and the main spacers 131 are arranged in an array, and the auxiliary spacers 132 and the main spacers 131 in the same row are linearly arranged the extension direction of the gate line. That is to say, compared with the conventional design, the auxiliary spacers 132 are not deviated while the second lug bosses 142 are deviated to realize the setting that the orthographic projection of the auxiliary spacer 132 on the second substrate 120 is preset distance away from the orthographic projection of the correspondingly arranged second lug boss 142 on the second substrate 120.

For instance, in some examples, as shown in FIG. 6, similarly, the orthographic projections of the main spacers 131 and the auxiliary spacers 132 on the second substrate fall into the orthographic projections of the BMs 150 on the second substrate 120, thereby reducing the impact of the main spacers and the auxiliary spacers on the aperture ratio of the display panel. At this point, as the orthographic projection of the auxiliary spacer on the second substrate is preset distance away from the orthographic projection of the correspondingly arranged second lug boss on the second substrate, the orthographic projection of the second lug boss may not fall into the orthographic projection of the BM on the second substrate, thereby avoiding the problem of reducing the aperture ratio of the display panel due to the increased width of the BMs. Of course, the embodiment of the present invention includes but not limited thereto, and the orthographic projection of the second lug boss on the second substrate may also fall into the orthographic projection of the BM on the second substrate.

Figure 7A:
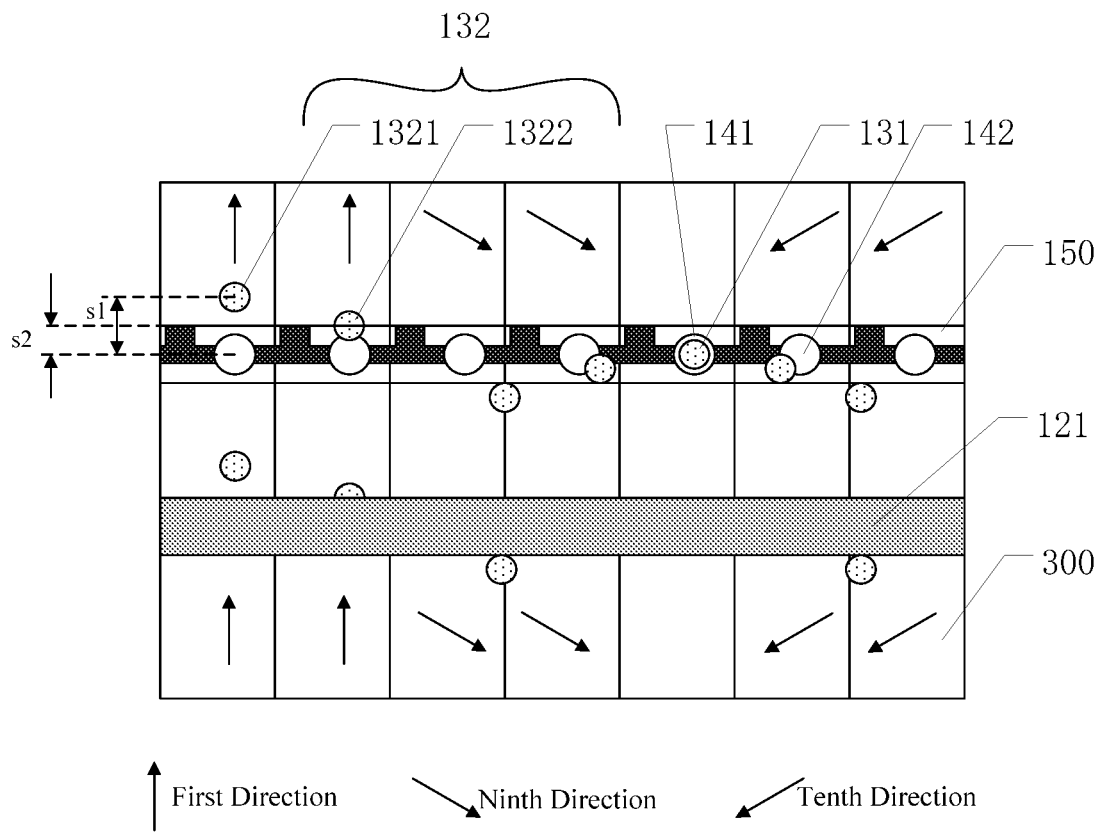
FIG. 7A is a schematic plan view of another display panel provided by one embodiment of the present invention.

It should be noted that the different offset directions in the present invention not only include the above cases of four directions and eight directions, and the specific offset directions may be set according to actual conditions. For instance, the different offset directions may only include three offset directions. FIG. 7A is a schematic plan view of a display panel provided by one embodiment of the present invention.

As shown in FIG. 7A, the plurality of offset directions include first direction, ninth direction and tenth direction. For instance, as shown in FIG. 7A, the first direction, the ninth direction and the tenth direction may be uniformly distributed, that is, an angle between the first direction and the ninth direction is 120°, and an angle between the ninth direction and the tenth direction is 120°.

Figure 7B:
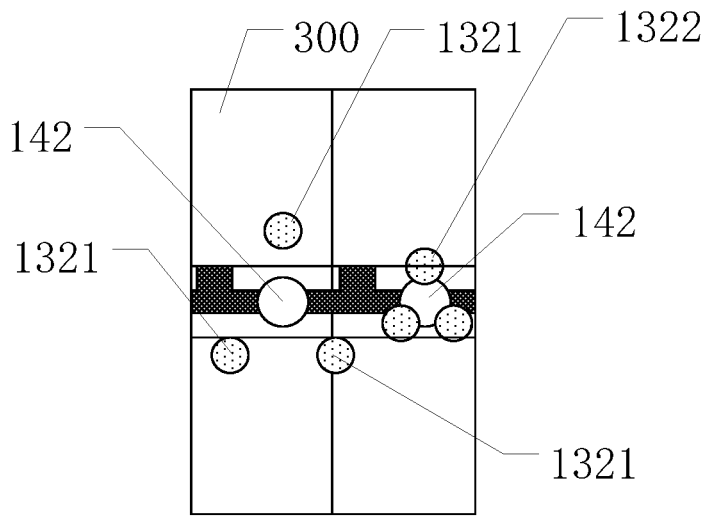
FIG. 7B is a schematic partial plan view of a display panel provided by one embodiment of the present invention.

For instance, in some examples, as shown in FIG. 7A, the display panel comprises a plurality of subpixel units 300. The subpixel unit 300 is correspondingly provided with one main spacer 131 or one auxiliary spacer 132. However, the present invention includes but not limited thereto, and one subpixel unit may also be provided with one auxiliary spacer or a plurality of auxiliary spacers. For instance, FIG. 7B is a schematic diagram of two pixel units in a display panel provided by one embodiment of the present invention. As shown in FIG. 7B, the subpixel unit 300 may be provided with three auxiliary spacers 1321 or 1322. Of course, the display panel provided by the embodiment of the present invention may also arrange more auxiliary spacers, e.g., four auxiliary spacers or eight auxiliary spacers, in one subpixel unit.

Figure 8:
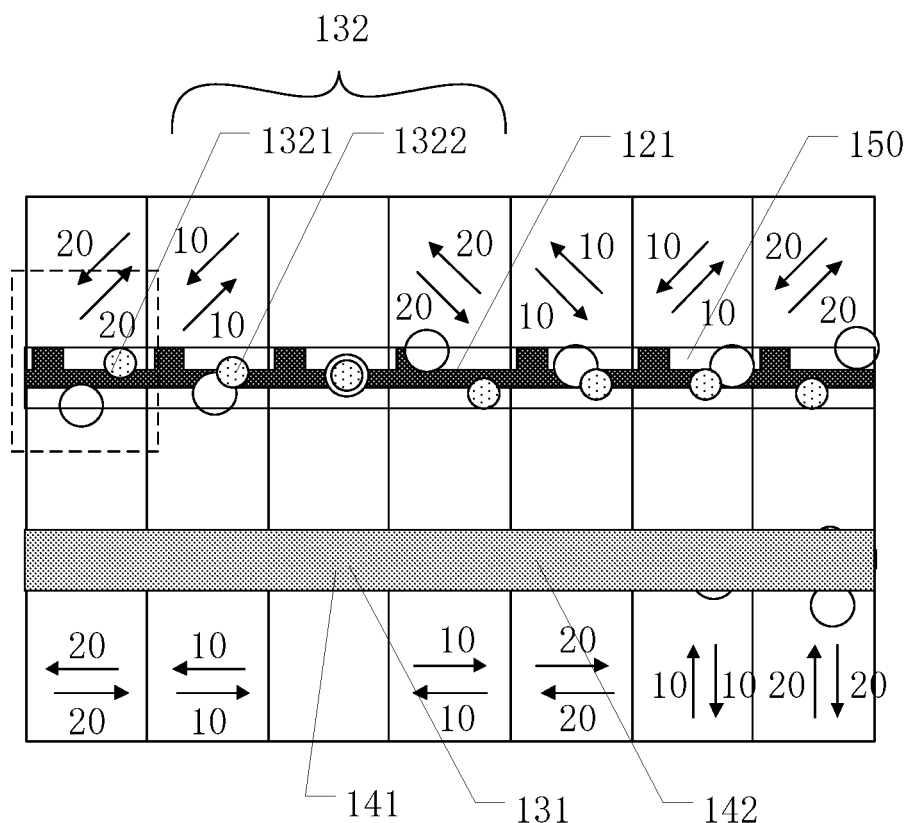
FIG. 8 is a schematic plan view of another display panel provided by one embodiment of the present invention.

FIG. 8 is a schematic plan view of a display panel provided by one embodiment of the present invention. As shown in FIG. 8, in the display panel, compared with the conventional design, both the auxiliary spacers 132 and the second lug bosses 142 are deviated to realize the setting that the orthographic projection of the auxiliary spacer 132 on the second substrate 120 is preset distance away from the orthographic projection of the correspondingly arranged second lug boss 142 on the second substrate 120 along the offset direction. For instance, as shown by the auxiliary spacer 132 and the second lug boss 142 in a dotted border in FIG. 8, the auxiliary spacer 132 moves 20 unit distance in the second direction, and the second lug boss 142 moves 20 unit distance in the fourth direction opposite to the second direction. Thus, relative to the second lug boss 142, the orthographic projection of the auxiliary spacer 132 on the second substrate 120 is 40 unit distance away from the orthographic projection of the correspondingly arranged second lug boss 142 on the second substrate 120. At this point, as shown in FIG. 8, the auxiliary spacer 132 and the second lug boss 142 are disposed at the edge of the BM 150 and not disposed in the center of the BM 150. Therefore, in the display panel, both the auxiliary spacer and the second lug boss are simultaneously deviated, on the premise of achieving same preset distance, the movement distance of the auxiliary spacer and the second lug boss relative to the second substrate is small, so the auxiliary spacer and the second lug boss can be disposed in the coverage range of the BM as much as possible, thereby further reducing the impact of the auxiliary spacer and the second lug boss on the aperture ratio of the display panel.

Figure 9:
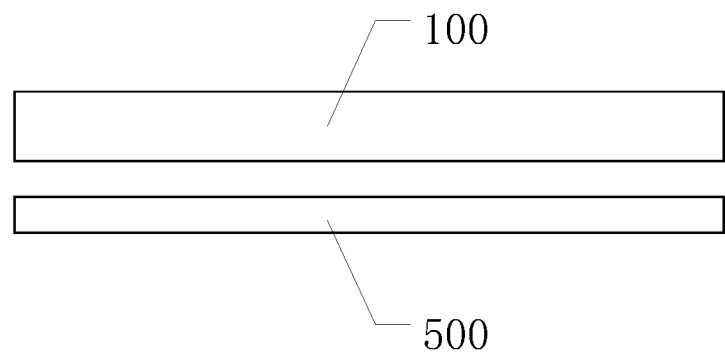
FIG. 9 is a schematic structural view of a display device provided by one embodiment of the present invention.

At least one embodiment of the present invention further provides a display device. FIG. 9 is a schematic structural view of a display device provided by one embodiment of the present invention. As shown in FIG. 9, the display device comprises the display panel 100 provided by any foregoing embodiment. Therefore, the display device also has the technical effects corresponding to the advantages of the display panel in the display device, and specific details may refer to the above description.

For instance, in some examples, the display device may be any product or component with display function such as a smart mobile phone, a tablet PC, a TV, a display, a notebook computer, a digital album or a navigator.

For instance, in some examples, the display device further comprises a backlight module 500 disposed on one side of the display panel 100 and configured to provide backlight for the display panel 100. It should be noted that the display device may further comprise components and devices for realizing other functions, and no limitation will be given here in the embodiment of the present invention.

For instance, in some examples, the display device may be any product or component with display function such as a smart mobile phone, a tablet PC, a TV, a display, a notebook computer, a digital album or navigator.

The following points should be noted:

(1) Only the structures relevant to the embodiments of the present disclosure are involved in the accompanying drawings of the embodiments of the present disclosure, and other structures may refer to the conventional design.

(2) The embodiments of the present disclosure and the features in the embodiments may be mutually combined without conflict.

The foregoing is only some specific embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A display panel, comprising:
a first substrate; and
a second substrate provided oppositely to the first substrate, wherein
a plurality of main spacers and a plurality of auxiliary spacers are provided on a side of the first substrate close to the second substrate; the second substrate further includes a plurality of first lug bosses and a plurality of second lug bosses; an orthographic projection of each of the main spacers on the second substrate is at least partially overlapped with an orthographic projection of a corresponding first lug boss on the second substrate; an orthographic projection of at least one of the auxiliary spacers on the second substrate is at least partly overlapped with an orthographic projection of a corresponding second lug boss on the second substrate;
a distance between each of the auxiliary spacers and the corresponding second lug boss in a direction perpendicular to the second substrate is less than a height of each of the first lug bosses in the direction perpendicular to the second substrate;
the plurality of auxiliary spacers include at least two auxiliary spacers, the at least two auxiliary spacers are deviated from the corresponding second lug bosses by different offset distances along an offset direction, so that an orthographic projection of at least one of the at least two auxiliary spacers is at least partly overlapped with an orthographic projection of the corresponding second lug boss in a case of a relative displacement between the first substrate and the second substrate of the display panel in a direction opposite to the offset direction;
wherein orthographic projection of the at least two auxiliary spacers on the second substrate are away from orthographic projections of the corresponding second lug bosses on the second substrate by different preset distances along the offset direction, and each of the preset distances is greater than 0, and wherein a distance from each of the at least two auxillary spacers to the corresponding second lug boss in a direction perpendicular to the second substrate is not zero.

2. The display panel according to claim 1, wherein the at least two auxiliary spacers include first auxiliary spacers and second auxiliary spacers; an orthographic projection of each of the first auxiliary spacers on the second substrate is away from the orthographic projection of the corresponding second lug boss on the second substrate by a first distance along the offset direction; an orthographic projection of each of the second auxiliary spacers on the second substrate is away from the orthographic projection of the corresponding second lug boss on the second substrate by a second distance along the offset direction; and the second distance is less than the first distance.

3. The display panel according to claim 2, wherein the second distance is one quarter to three quarters of the first distance.

4. The display panel according to claim 1, wherein the orthographic projections of the at least two auxiliary spacers on the second substrate are away from the orthographic projections of the corresponding second lug bosses on the second substrate by the preset distance along different offset directions.

5. The display panel according to claim 4, wherein the height of each of the main spacers in the direction perpendicular to the second substrate is greater than a height of each of the at least two auxiliary spacers in the direction perpendicular to the second substrate.

6. The display panel according to claim 5, wherein the different offset directions include a first direction, a second direction, a third direction and a fourth direction; the first direction is opposite to the fourth direction; the second direction is opposite to the third direction; and the first direction is perpendicular to the second direction.

7. The display panel according to claim 6, wherein the different offset directions further include a fifth direction, a sixth direction, a seventh direction and an eighth direction; the fifth direction is opposite to the eighth direction; the sixth direction is opposite to the seventh direction; an angle between the fifth direction and the first direction is in a range of 30-60°; and an angle between the sixth direction and the second direction is in a range of 30-60°.

8. The display panel according to claim 7, wherein the angle between the fifth direction and the first direction is 45°; and the angle between the sixth direction and the second direction is 45°.

9. The display panel according to claim 6, wherein the second substrate further includes:
gate lines, wherein
the main spacers are arranged in an array; and the main spacers in a same row are linearly arranged along an extension direction of the gate lines.

10. The display panel according to claim 9, wherein the first direction is perpendicular to the extension direction of the gate lines.

11. The display panel according to claim 9, wherein the second lug bosses are arranged in an array on the second substrate; and the second lug bosses in a same row are linearly arranged along the extension direction of the gate lines.

12. The display panel according to claim 9, wherein the auxiliary spacers and the main spacers are arranged in an array; and the auxiliary spacers and the main spacers in a same row are linearly arranged along the extension direction of the gate lines.

13. The display panel according to claim 1, further comprising:
a black matrix on the first substrate or the second substrate, wherein
the orthographic projections of the main spacers on the second substrate fall into an orthographic projection of the black matrix on the second substrate.

14. The display panel according to claim 13, wherein a shortest distance between an edge of the black matrix and an edge of each of the main spacers is less than 15 μm.

15. The display panel according to claim 1, wherein in areas provided with the first lug bosses or the second lug bosses, the second substrate includes thin-film transistors.

16. The display panel according to claim 1, wherein the preset distance is an offset distance between the first substrate and the second substrate under an external force.

17. The display panel according to claim 13, wherein the auxiliary spacers and the second lug bosses are arranged on an edge part of the black matrix.

18. A display device, comprising the display panel according to claim 1.

19. The display panel according to claim 1, wherein the height of each of the main spacers in the direction perpendicular to the second substrate is greater than a height of each of the auxiliary spacers in the direction perpendicular to the second substrate.

* * * * *